(12) United States Patent
Tanabe

(10) Patent No.: US 6,740,953 B2
(45) Date of Patent: May 25, 2004

(54) HIGH FREQUENCY INTEGRATED DEVICES

(75) Inventor: Mitsuru Tanabe, Katano (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 10/106,221

(22) Filed: Mar. 27, 2002

(65) Prior Publication Data

US 2002/0140049 A1 Oct. 3, 2002

(30) Foreign Application Priority Data

Mar. 27, 2001 (JP) ......................................... 2001-088940
Mar. 6, 2002 (JP) ......................................... 2002-059597

(51) Int. Cl.[7] .................... H01L 29/00; H01L 23/48; H01L 29/40
(52) U.S. Cl. ...................... 257/499; 257/500; 257/501; 257/506; 257/751
(58) Field of Search ................... 257/499–515, 257/751

(56) References Cited

U.S. PATENT DOCUMENTS

| | | | | |
|---|---|---|---|---|
| 4,470,062 A | * | 9/1984 | Muramatsu | .................. 357/50 |
| 4,805,008 A | * | 2/1989 | Yao et al. | ...................... 357/42 |
| 4,819,052 A | * | 4/1989 | Hutter | .......................... 357/49 |
| 4,924,284 A | | 5/1990 | Beyer et al. | ................... 357/49 |
| 5,442,223 A | * | 8/1995 | Fujii | ........................... 257/506 |
| 5,479,048 A | * | 12/1995 | Yallup et al. | ................ 257/321 |
| 6,396,107 B1 | * | 5/2002 | Brennan et al. | ............. 257/362 |

FOREIGN PATENT DOCUMENTS

| | | |
|---|---|---|
| JP | 08172124 A | 7/1996 |
| JP | 2000269319 A | 9/2000 |

* cited by examiner

Primary Examiner—Tom Thomas
Assistant Examiner—Jesse A. Fenty
(74) Attorney, Agent, or Firm—Parkhurst & Wendel, L.L.P.

(57) ABSTRACT

The present invention has an object to provide a high frequency integrated device which can obtain sufficient isolation even in a high frequency region of which handling frequency exceeds gigahertz[GHz]. In a semiconductor device having an element isolation structure obtained by trench isolation, in which an insulator fills the inside of a trench formed in a semiconductor substrate, the insulator filling the trench includes a conductive material region, and the conductive material region is grounded through coupling at high frequency. With this configuration, electromagnetic waves coupled to the conductive material inside the trench are propagated to ground, thereby preventing high-frequency interference with other regions.

13 Claims, 15 Drawing Sheets

HIGH FREQUENCY INTEGRATED DEVICES

FIELD OF THE INVENTION

The present invention relates to closely spaced circuits each of which should never be carelessly coupled to each other at high frequency, and more specifically to a high frequency integrated device having an element isolation region formed by trench isolation.

BACKGROUND OF THE INVENTION

In recent years, as solutions for technical problems of an element isolation structure formed by LOCOS isolation, many methods of trench isolation (referred to as V-trench or U-trench isolation depending upon the shape of a trench) have been proposed, in which a deep trench is provided in a region for forming a LOCOS oxidation film of a semiconductor substrate and insulator fills the trench. Further, a method for filling a conductive material in a trench also has been proposed.

As shown in FIG. 18, in a method for isolating an element that uses trench isolation of a first conventional art (Japanese Patent Laid-Open No. 8-172124), an insulator 104, which is embedded into a trench 102 formed on a substrate 101, protrudes from a surface of the substrate 101 on a trench upper part 103 and extends with an opening size width or more of the trench 102. At least both sides 103a are chamfered or formed into segments, and the insulator 104 filling the trench 102 includes a region of a conductive material 105 (polysilicon is a representative material, and doped polysilicon is also applicable).

Moreover, as shown in FIG. 19, in a second conventional art (Japanese Patent Laid-Open No. 2000-269319), embedded wiring 204 is partially embedded by an insulator 203 in a trench 202 formed on a substrate 201.

Also, as shown in FIG. 20, in a third conventional art (Japanese Patent Laid-Open No. 7-273288), a trench 302 is formed on the circumference of a predetermined circuit element formed on a substrate 301, an insulator 304 and a polysilicon resistor 303 used for element isolation are embedded in the trench 302, and a contact is formed for wiring on a predetermined position in the trench 302, so that the trench 302 is used as a resistor.

Additionally, as shown in FIG. 21, in a fourth conventional art (Japanese Patent Laid-Open No. 5-29603), an element isolation trench 402 and a power supply trench 403 are formed on a substrate 401, the substrate 401 is exposed at the bottom of the power supply trench 403, tungsten 404 is embedded by selective vapor growth, a non-doped polysilicon 405 is simultaneously embedded in the remaining part of the power supply trench 403 and in the element isolation trench 402, a polysilicon film 406, which is doped with a high concentration, is formed on polysilicon 405 in the power supply trench 403, and the substrate 401 is subjected to heat treatment so as to form power supply wiring 407.

Meanwhile, LSI with a SiG-BiCMOS (Silicon Germanium-Bipolar-CMOS) structure has been developed in recent years. In such LSI, a bipolar transistor, which uses Silicon Germanium for a base layer and can perform a superhigh frequency operation, and an MIS transistor such as a CMOS transistor, which has a high packaging density with small power consumption, are formed on the same substrate, so that highly integrated LSI can be achieved at high speed with low power consumption. When SiGeBiC-MOS is used in a region whose handling frequency exceeds gigahertz[GHz], conventional isolating methods cannot obtain high-frequency isolation under present circumstances.

When a circuit handles a higher frequency, a coupling degree in an electromagnetic field is increased between apart regions due to parasitic capacitances and radiation. Namely, unnecessary interference occurs between function blocks (circuits), resulting in serious influence on the capability of circuits. In order to obtain high-frequency (electromagnetic) separation (isolation), interruption needs be provided so as to set a potential to 0 at high frequency between regions (circuits).

To be specific, in the method of the first conventional art, the included conductive material 105 is grounded by making contact with the substrate 101 having a fixed potential. However, since the substrate 101 is a resistor, resistance exists between the conductive material 105 and ground through the substrate 101. Hence, a potential of the conductive material 105 is not stabilize for high frequency, so that high-frequency isolation cannot be obtained in regions 101A and 101B on the sides of the trench 102.

Further, in the method of the second conventional art, the wiring 204 is embedded in the trench 202. The wiring 204 is not always connected to a high frequency ground (RF ground) that has a stabilized potential such as a power supply, ground and the like. Even if the wiring 204 is connected to RF ground, the wiring 204 does not entirely cover the trench 202. Thus, even if the wiring 204 is used for high-frequency isolation, high-frequency isolation cannot be obtained in regions 201A and 201B on the sides of the trench 202.

Besides, in the method of the third conventional art, the polysilicon resistor 303 is used in the trench 302. A potential is not stabilized because of the resistance of the polysilicon resistor 303, and like the first conventional art, an electromagnetic wave is not terminated on the polysilicon. Hence, high-frequency interruption cannot be achieved.

Additionally, in the method of the fourth conventional art, like the first conventional art, since the substrate 401 is not a perfect conductor, there exists resistance between the tungsten 404 and the substrate 401. Since the polysilicon film 406 also has R (resistance) serving as a resistor, a potential on the polysilicon is not stabilized.

In this manner, although the conventional methods are configured such that a conductive material fills a trench to improve isolation characteristics, sufficient isolation cannot be obtained in a high frequency region whose handling frequency exceeds gigahertz[GHz] under present circumstances.

The present invention has as its object the provision of a high frequency integrated device which can achieve sufficient isolation even in a high frequency region whose handling frequency exceeds gigahertz[GHz] in the formation of a trench isolation structure for filling a conductive material in a trench.

DISCLOSURE OF THE INVENTION

A high frequency integrated device according to claim 1 of the present invention is characterized in that it comprises a semiconductor substrate having a trench formed therein, the trench being filled inside thereof, via an insulating film, with a conductive material having lower resistance than that of the insulating film, the conductive material being grounded through coupling at high frequency. Here, to be grounded through coupling at high frequency may be paraphrased as to be connected to a point potentially stabilized at high frequency. That is, the conductive material is connected to a potentially stabilized conductor such as ground and power supply.

A high frequency integrated device according to claim 2 of the present invention is characterized in that in claim 1, the conductive material is directly connected to a potentially stabilized conductor formed of a conductive substance.

A high frequency integrated device according to claim 3 of the present invention is characterized in that in claim 1, the conductive material is connected to a ground conductor formed of a conductive substance via a capacitance that is sufficient to make a short circuit at a handling frequency. That is, the conductive material is connected to a potentially stabilized conductor.

A high frequency integrated device according to claim 4 of the present invention is characterized in that in claims 1 to 3, an insulating film comprising one or more layers is formed on a side wall and a bottom of the trench.

A high frequency integrated device according to claim 5 of the present invention is characterized in that in claims 1 to 4, an impurity region is formed on the side wall and the periphery of the bottom of the trench.

A high frequency integrated device according to claim 6 of the present invention is characterized in that in claim 1, the trench is formed on a major surface of the semiconductor substrate, and the conductive material is grounded to a ground conductor through coupling at high frequency, the ground conductor being formed on the major surface of the semiconductor substrate via an interlayer insulating film. Here, to be grounded through coupling at high frequency may be paraphrased as to be connected to a point potentially stabilized at high frequency. That is, the conductive material is connected to a potentially stabilized conductor.

A high frequency integrated device according to claim 7 of the present invention is characterized in that in claim 1, the semiconductor substrate is made of Si.

A high frequency integrated device according to claim 8 of the present invention is characterized in that in claims 1 to 7, the semiconductor substrate has circuit regions formed thereon, each of the circuit regions being formed by one or more semiconductor elements selected from a group consisting of an N-type channel MOSFET, a P-type channel MOSFET and a bipolar transistor, and the trench is formed so as to divide the circuit region.

A high frequency integrated device according to claim 9 of the present invention is characterized in that in claims 1 to 8, the semiconductor substrate has $Si_{(1-x)}Gex (0<x\leq1)$ as a main material.

A high frequency integrated device according to claim 10 of the present invention is characterized in that it comprises a semiconductor substrate having first and second trenches formed in the semiconductor substrate, each of the trenches being filled with an insulator, and a conductive region formed in a position between the first and second trenches, the conductive region being grounded through coupling at high frequency. Here, to be grounded through coupling at high frequency means to be connected to a point potentially stabilized at high frequency.

A high frequency integrated device according to claim 11 of the present invention is characterized in that it comprises a semiconductor substrate having a trench filled with an insulator, a first conductive region formed in a position outside the trench, and a second conductive region formed outside the first conductive region so as to be separated from the first conductive region. The first conductive region is grounded through coupling at high frequency, and bias voltage is applied to the second conductive region to cause depletion so as to reduce a coupling capacitance of the first conductive region and the second conductive region. Here, to be grounded through coupling at high frequency means to be connected to a point potentially stabilized at high frequency.

A high frequency integrated device according to claim 12 of the present invention is characterized in that in claim 11, the first conductive region is grounded at DC as a P-type doped region, and the second conductive region is used as an N-type doped region and applied with positive bias. Here, to be grounded at DC may be paraphrased as to be connected to a point potentially stabilized at DC.

A high frequency integrated device according to claim 13 of the present invention is characterized in that in claim 12, the conductive regions are each formed by implanting impurity.

A high frequency integrated device according to claim 14 of the present invention is characterized in that in any one of claims 10 to 13, the semiconductor substrate is made of a material being more excellent than Si in insulating capability under direct current, and the trench is eliminated.

DESCRIPTION OF THE EMBODIMENTS

Figure 1:
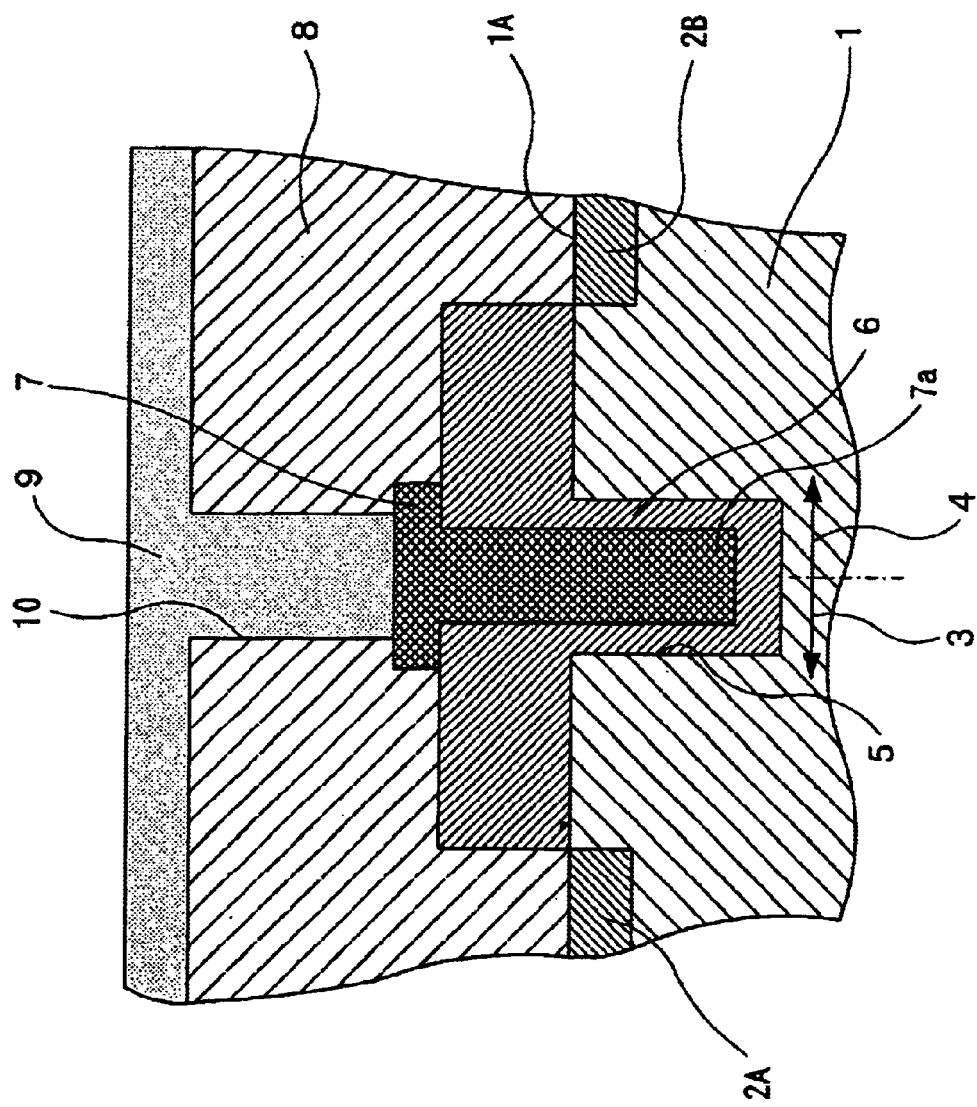
FIG. 1 is an enlarged sectional view showing a high frequency integrated device according to an Embodiment 1 of the present invention.

Referring to FIGS. 1. to 17, the following will discuss embodiments of the present invention.

(Embodiment 1)

Figure 2:
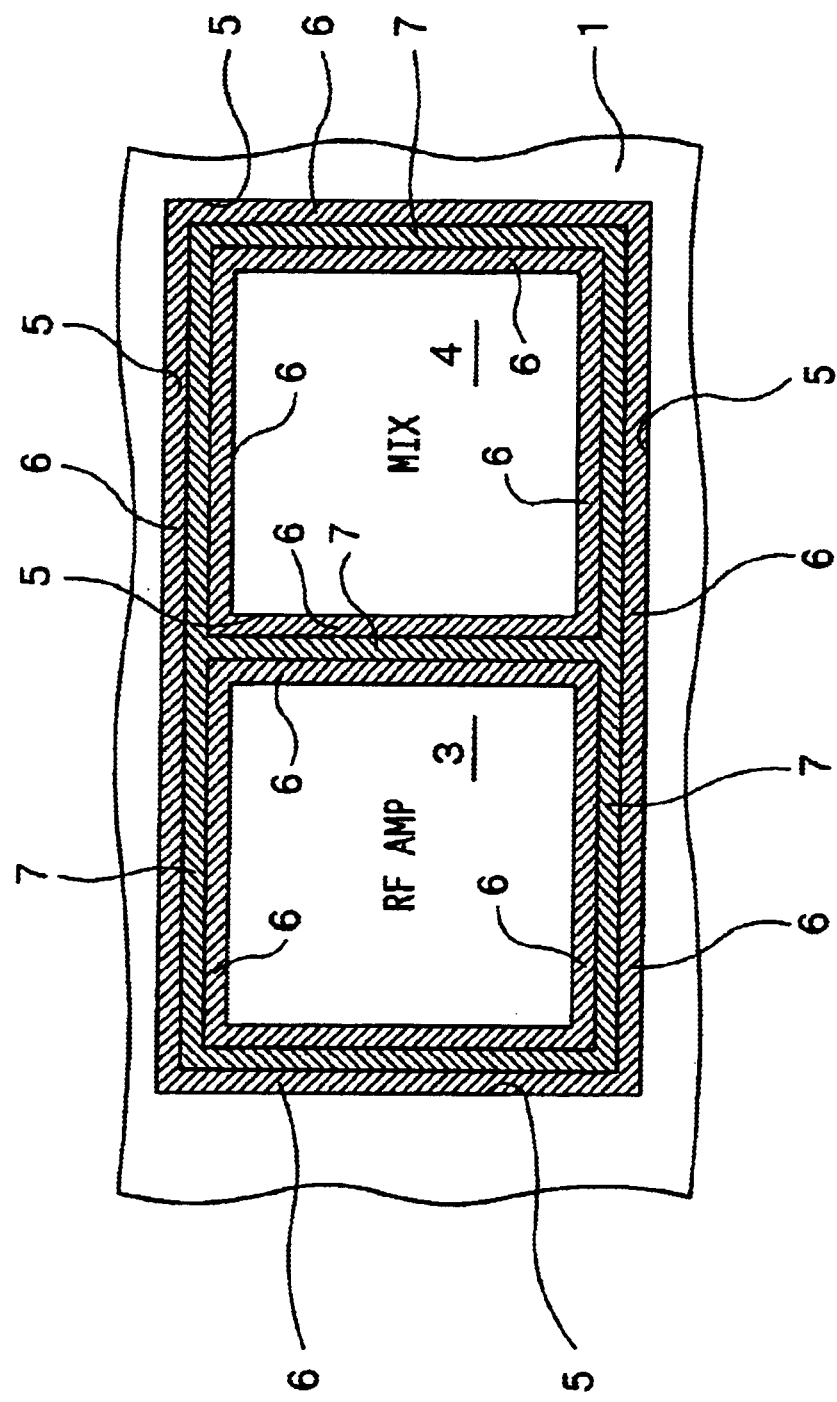
FIG. 2 is a horizontal sectional view showing a part around a major surface of a semiconductor substrate in a manufacturing process according to the Embodiment 1.

FIGS. 1 and 2 show (Embodiment 1) of the present invention.

As shown in FIG. 1, in a high frequency integrated device of (Embodiment 1) of the present invention, a first circuit region 2A and a second circuit region 2B are formed by performing ion implantation on a major surface 1A of a semiconductor substrate 1 made of Si.

To be specific, the high frequency integrated device is constituted by a high frequency amplifier 3, which amplifies a high frequency signal whose handling frequency exceeds gigahertz[GHz], and a mixer circuit 4, which converts an output signal of the high-frequency amplifier 3 to a first intermediate frequency. The first circuit region 2A is used for the high-frequency amplifier 3, and the second circuit region 2B is used for the mixer circuit 4.

A trench 5 is formed on the semiconductor substrate 1 between the high-frequency amplifier 3 and the mixer circuit 4 so as to surround the high-frequency amplifier 3 and the mixer circuit 4.

As shown in FIG. 1, on the inner wall of the trench 5, a conductive material 7 is embedded via an insulator 6. FIG. 2 shows a forming state of the trench 5, which is formed so as to surround the high-frequency amplifier 3 and the mixer circuit 4, and the insulator 6 and the conductive material 7 that are embedded in the trench 5.

Further, as shown in FIG. 1, an interlayer insulating film 8 is formed on the upper layers of the first circuit region 2A, the insulator 6, the conductive material 7, and the second circuit region 2B. Moreover, a ground conductor 9 is formed so as to cover the high-frequency amplifier 3 and the mixer circuit 4. When the ground conductor 9 is formed, a hole 10 reaching the conductive material 7 is formed on the interlayer insulating film 8, and the ground conductor 9 is also formed in the hole 10, so that the ground conductor 9 is directly connected to the conductive 7.

Additionally, the conductive material 7 is made of a material which has lower resistance than the insulator 6. It is also possible to use silicide and so on as well as aluminum, which is a material of wiring.

With this configuration, since the trench structure has the conductive material 7 therein, electromagnetic waves are coupled to the conductive material 7 in the trench. Further, since the conductive material 7 is connected to the ground conductor 9 and is grounded through coupling at high frequency, the coupled electromagnetic waves are propagated to the ground without causing interference with other regions. Moreover, an end 7a of the conductive material 7 is entirely covered with the trench, thereby completely interrupting leakage of high frequency electromagnetic wave to the outside of the region.

Therefore, it is possible to obtain high-frequency isolation of the first circuit region 2A and the second circuit region 2B in a high frequency region whose handling frequency exceeds gigahertz[GHz].

Besides, DC isolation can be improved by forming an insulating film comprising one or more layers on the side wall and the bottom of the trench 5. When an insulating film composed of two or more layers is formed on the side wall and the bottom of the trench 5, in view of manufacturing, it is preferable to form a first layer by using a silicon oxidation film and to form a silicon nitriding film thereon.

(Embodiment 2)

Figure 3:
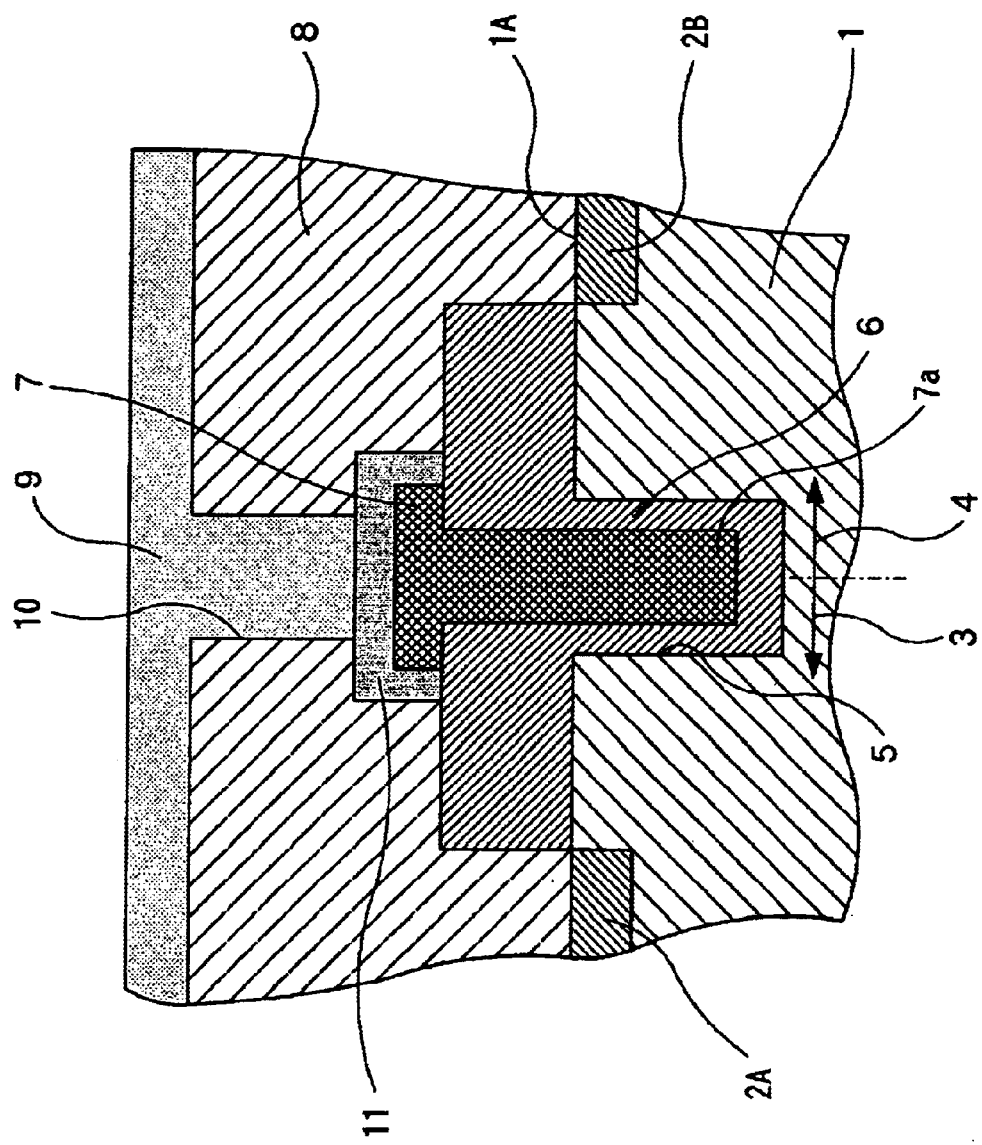
FIG. 3 is an enlarged sectional view showing a high frequency integrated device according to an Embodiment 2 of the present invention.

FIG. 3 shows (Embodiment 2) of the present invention.

In (Embodiment 1), the conductive material 7 is directly connected to the ground conductor 9. (Embodiment 2) is different from (Embodiment 1) only in that a conductive material 7 is connected to a ground conductor 9 via capacitance components, so that the same reference numerals are used for explanation.

In FIG. 3, on the conductive material 7 whose end is embedded into a trench 5 via an insulator 6, an MIM insulating film 11 for forming an MIM capacitance is formed so as to cover the exposed conductive material 7, an interlayer insulating film 8 is formed thereon, a hole 10 is formed so as to reach the MIM insulating film 11 in the interlayer insulating film 8, the ground conductor 9 is formed in the hole 10 as well, and the ground conductor 9 makes contact via the conductive material 7 and the MIM insulating film 11.

An MIM capacitance, which is formed by the MIM insulating film 11 between the ground conductor 9 and the conductive material 7, has a value that is sufficient to make a short circuit at a minimum handling frequency in a high frequency region exceeding gigahertz[GHz].

With this configuration, like (Embodiment 1), it is possible to obtain high-frequency isolation of a first circuit region 2A and a second circuit region 2B at the above handling frequency. In addition, since the MIM capacitance has high impedance in a low-frequency region, noise components occurring on the ground conductor 9 do not interfere with other parts from the conductive material 7.

(Embodiment 3)

Figure 4:
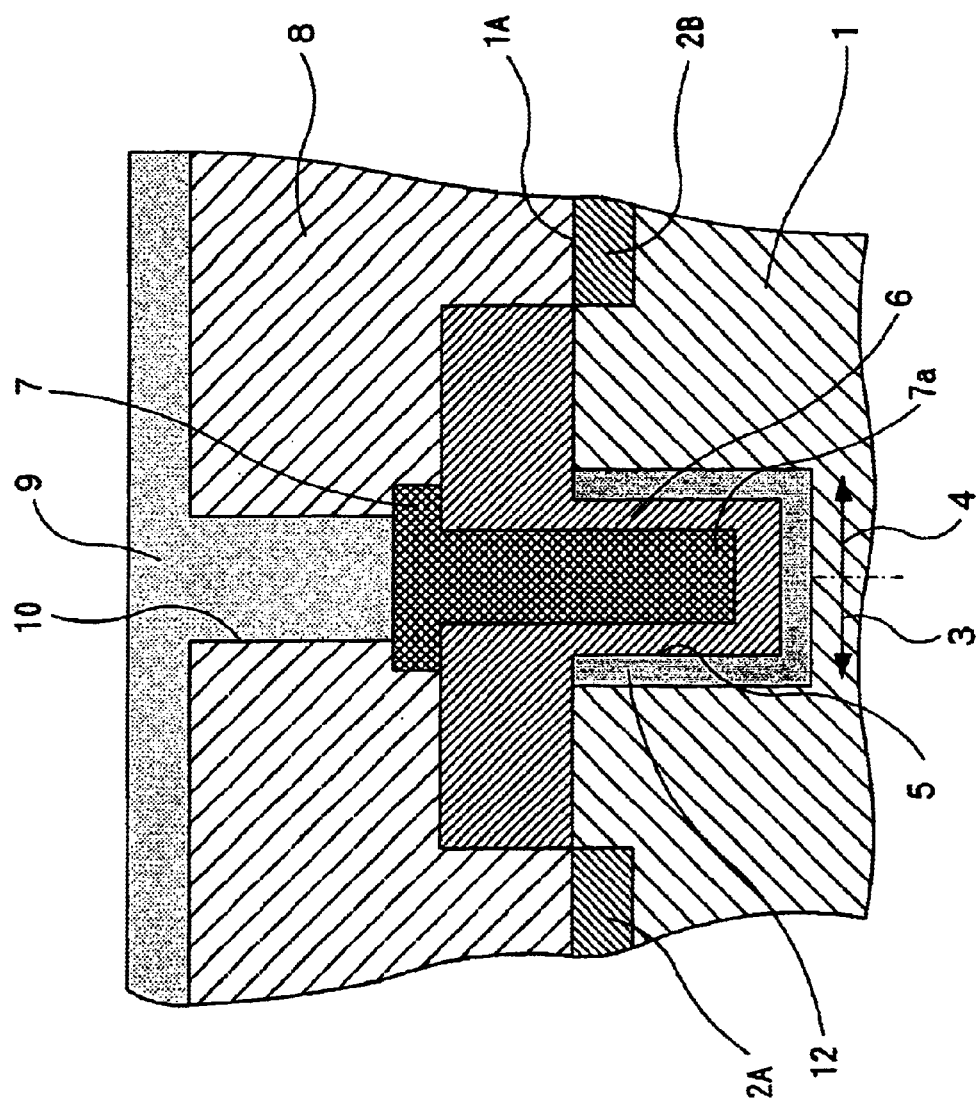
FIG. 4 is an enlarged sectional view showing a high frequency integrated device according to an Embodiment 3 of the present invention.

FIG. 4 shows (Embodiment 3) of the present invention.

(Embodiment 3) is different from (Embodiment 1) only in that an impurity region 12 is formed on the side wall and the periphery of the bottom of a trench 5.

In this manner, the impurity region 12 is formed so as to form an inversion preventing region, thereby improving DC isolation characteristics.

Besides, (Embodiment 3) can be carried out in the same manner as (Embodiment 2).

(Embodiment 4)

FIGS. 5 to 11 show (Embodiment 4) of the present invention. The members having the same functions as those of (Embodiment 1) are indicated by the same reference numerals.

FIGS. 5 to 11 show a bipolar transistor, an N-type channel MOSFET, and a P-type channel MOSFET that use the element isolation region shown in FIG. 1 of the present invention, and a circuit constituted by these transistors.

Figure 5:
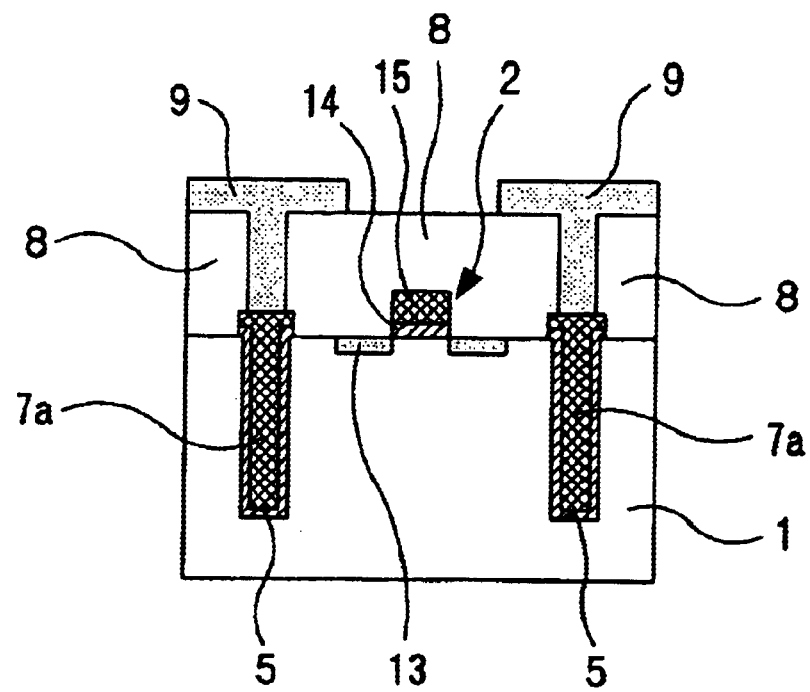
FIG. 5 is an enlarged sectional view showing an N-type channel MOSFET according to an Embodiment 4 of the present invention.

To be specific, FIG. 5 shows that a circuit region 2 is formed by an N-type channel MOSFET. Reference numeral 13 denotes an n-type impurity region formed on a semiconductor substrate 1, reference numeral 14 denotes a gate insulating film, and reference numeral 15 denotes gate electrode. A trench 5 is formed on the semiconductor substrate 1 so as to surround the circuit region 2.

Figure 6:
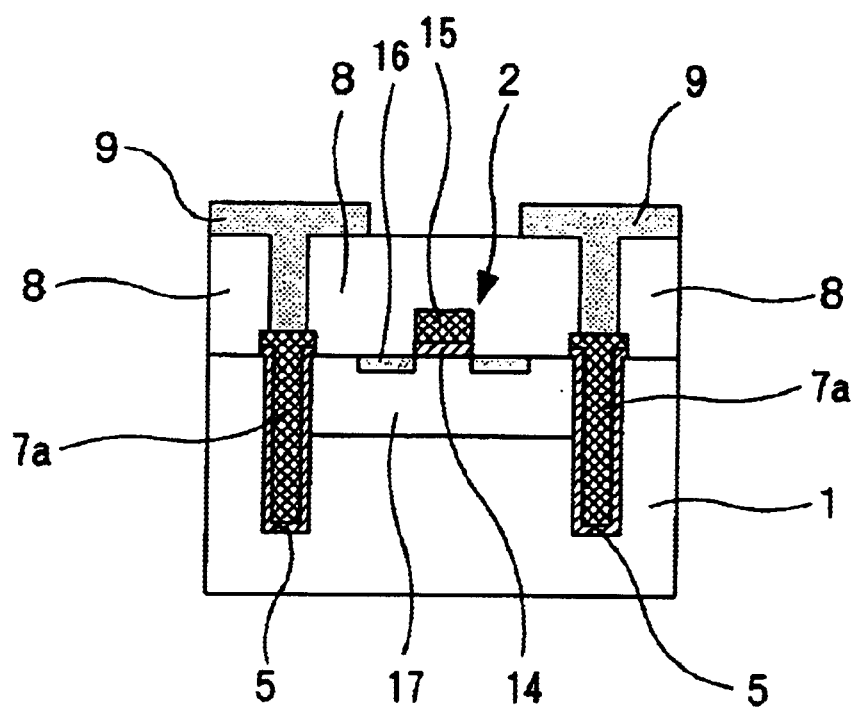
FIG. 6 is an enlarged sectional view showing a P-type channel MOSFET according to the Embodiment 4 of the present invention.

FIG. 6 shows that a circuit region 2 is formed by a P-type channel MOSFET. Reference numeral 16 denotes a p-type impurity region formed on a semiconductor substrate 1, reference numeral 14 denotes a gate insulating film, reference numeral 15 denotes gate electrode, and reference numeral 17 denotes an n-type impurity region (well). A trench 5 is formed on the semiconductor substrate 1 so as to surround the circuit region 2.

Figure 7:
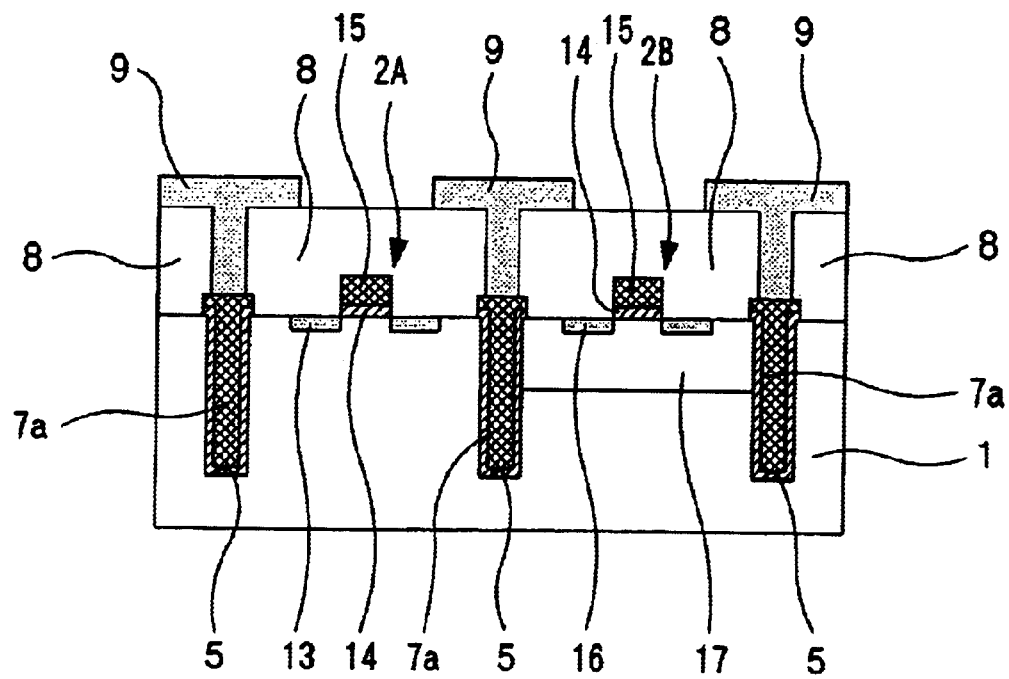
FIG. 7 is an enlarged sectional view showing an N-type channel MOSFET and a P-type channel MOSFET according to the Embodiment 4 of the present invention.

FIG. 7 shows that a circuit region 2A is constituted by an N-type channel MOSFET, a circuit region 2B is constituted by a P-type channel MOSFET, and a trench 5 is formed on a semiconductor substrate 1 so as to surround the circuit regions 2A and 2B.

Figure 8:
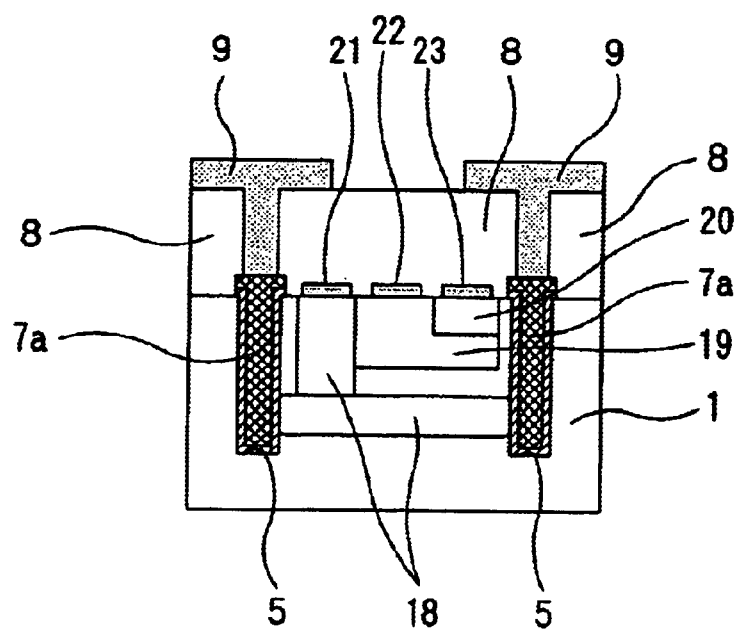
FIG. 8 is an enlarged sectional view showing a bipolar transistor according to the Embodiment 4 of the present invention.

FIG. 8 shows that a circuit region 2 is constituted by a bipolar transistor. Reference numeral 18 denotes collector regions, reference numeral 19 denotes a base region, reference numeral 20 denotes an emitter region, reference numeral 21 denotes a collector electrode, reference numeral 22 denotes a base electrode, and reference numeral 23 denotes an emitter electrode. A trench is formed on a semiconductor substrate 1 so as to surround the circuit region 2.

Figure 9:
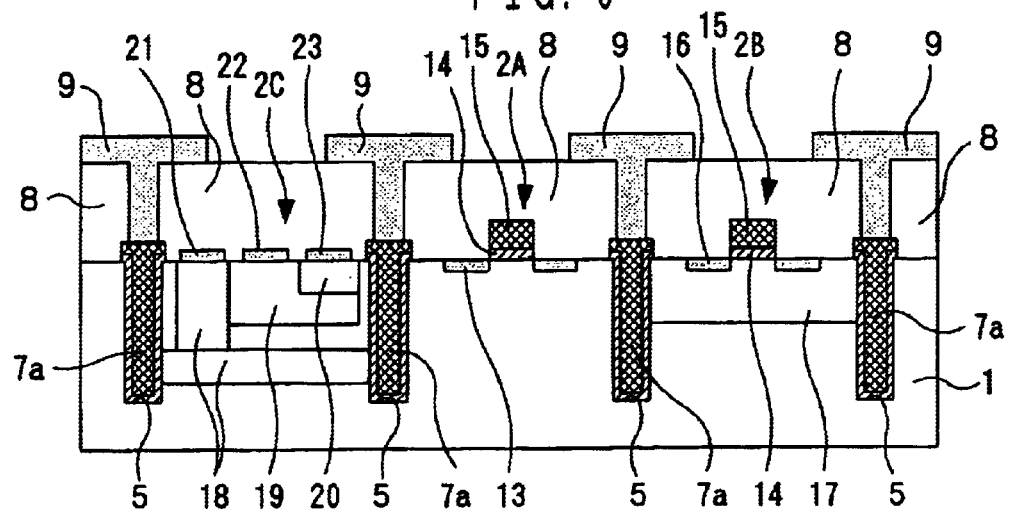
FIG. 9 is an enlarged sectional view showing the N-type channel MOSFET, the P-type channel MOSFET, and a bipolar transistor according to the Embodiment 4 of the present invention.

FIG. 9 shows that a circuit region 2A is constituted by an N-type channel MOSFET, a circuit region 2B is constituted by a P-type channel MOSFET, a circuit region 2C is constituted by a bipolar transistor, and a trench 5 is formed on a semiconductor substrate 1 so as to surround and separate circuit regions 2A, 2B, and 2C.

Figure 10:
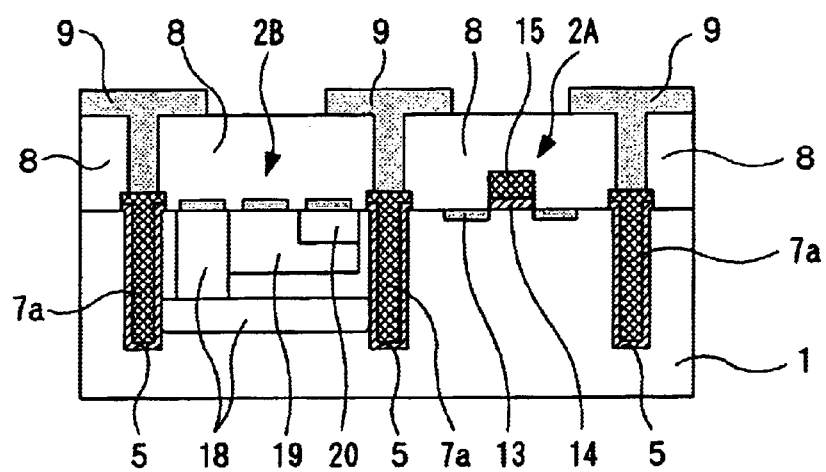
FIG. 10 is an enlarged sectional view showing the N-type channel MOSFET and the bipolar transistor according to the Embodiment 4 of the present invention.

FIG. 10 shows that a circuit region 2A is constituted by an N-type channel MOSFET, a circuit region 2B is constituted by a bipolar transistor, and a trench 5 is formed on a semiconductor substrate 1 so as to surround and separate the circuit regions 2A and 2B.

Figure 11:
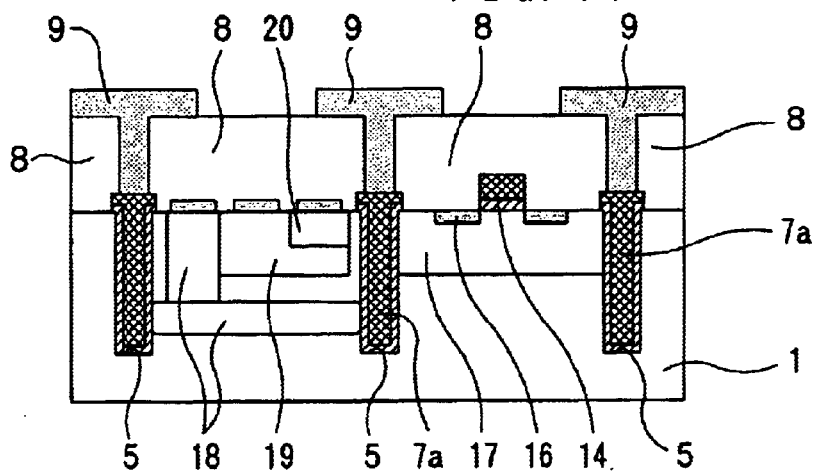
FIG. 11 is a sectional view showing a circuit constituted by a P-type channel MOSFET and a bipolar transistor that employs a first example of the present invention.

FIG. 11 shows that a circuit region 2A is constituted by a P-type channel MOSFET, a circuit region 2B is constituted by a bipolar transistor, and a trench 5 is formed on a semiconductor substrate 1 so as to surround and separate the circuit regions 2A and 2B.

In this manner, when the element isolation region of (Embodiment 1) is applied to the circuit constituted by the bipolar transistor, the circuit constituted by the N-type channel MOSFET, the circuit constituted by the P-type channel MOSFET, and the circuit constituted by these transistors, it is possible to obtain high-frequency isolation between circuit regions even in a high frequency region whose handling frequency exceeds gigahertz[GHz].

Additionally, in (Embodiment 4), the conductive material 7 is directly connected to the ground conductor 6. When the conductive material 7 is in contact with the ground conductor 6 via the MIM insulating film 11 in the same manner as (Embodiment 2), the configuration of (Embodiment 3) having the impurity region 12 formed on the side wall and the periphery of the bottom of the trench 5 can be similarly carried out. When the conductive 7 is in contact with the ground conductor 6 via the MIM insulating film 11 like (Embodiment 2), a plurality of combinations of (Embodiment 1), (Embodiment 2), and (Embodiment 3) can be similarly carried out.

Besides, the above-mentioned embodiments are quite effective in combination with the bipolar transistor (such as a SiGe-BICMOS structure), in which a main material of the semiconductor substrate 1 is $Si_{(1-x)}Ge_x(0<x\leq1)$, the isolation structure is particularly effective in a high frequency region, high element capability is obtained in a high frequency region, and Silicon Germanium is used as a base layer.

(Embodiment 5)

Figure 12:
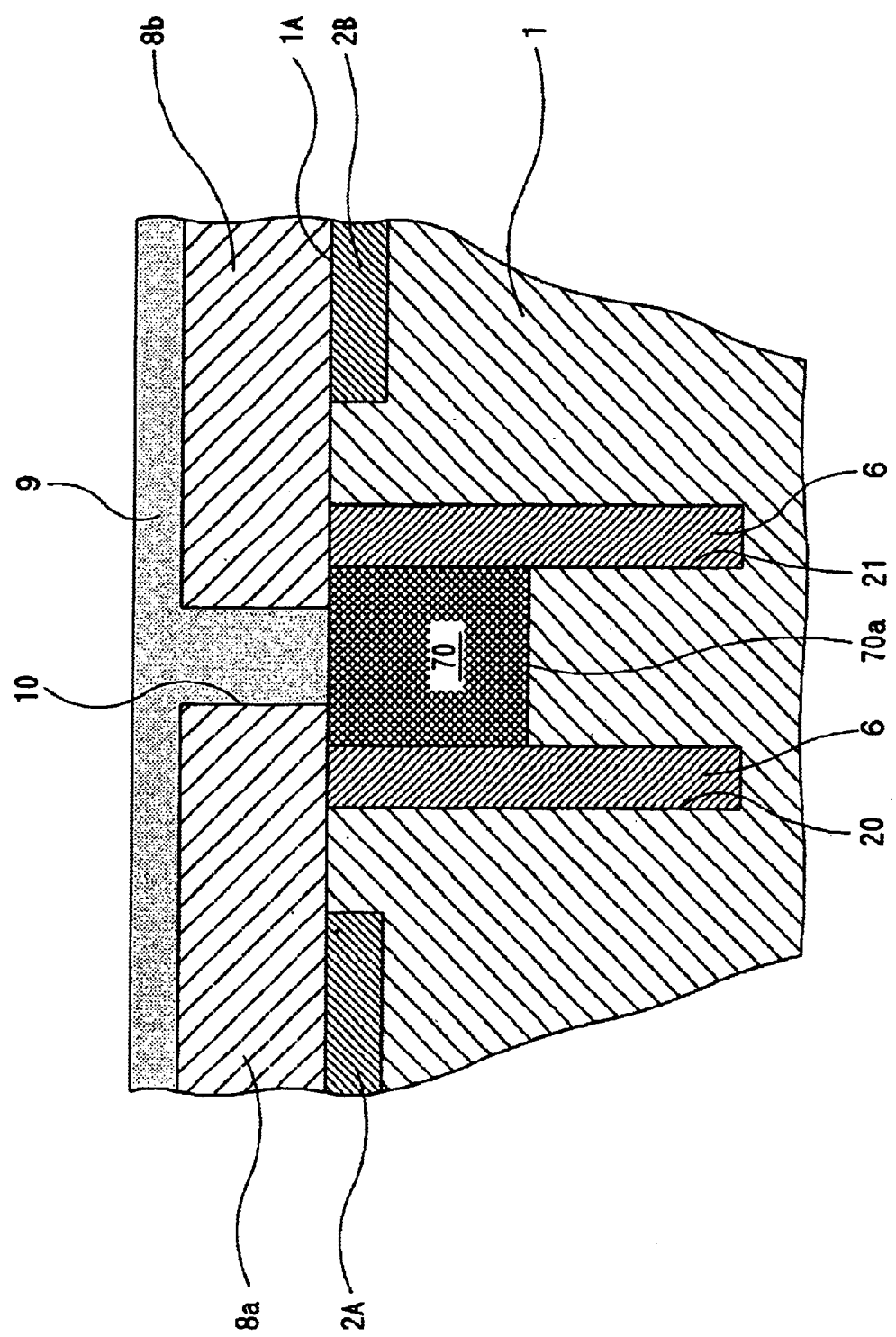
FIG. 12 is an enlarged sectional view showing a high frequency integrated circuit according to an Embodiment 5 of the present invention.
Figure 13:
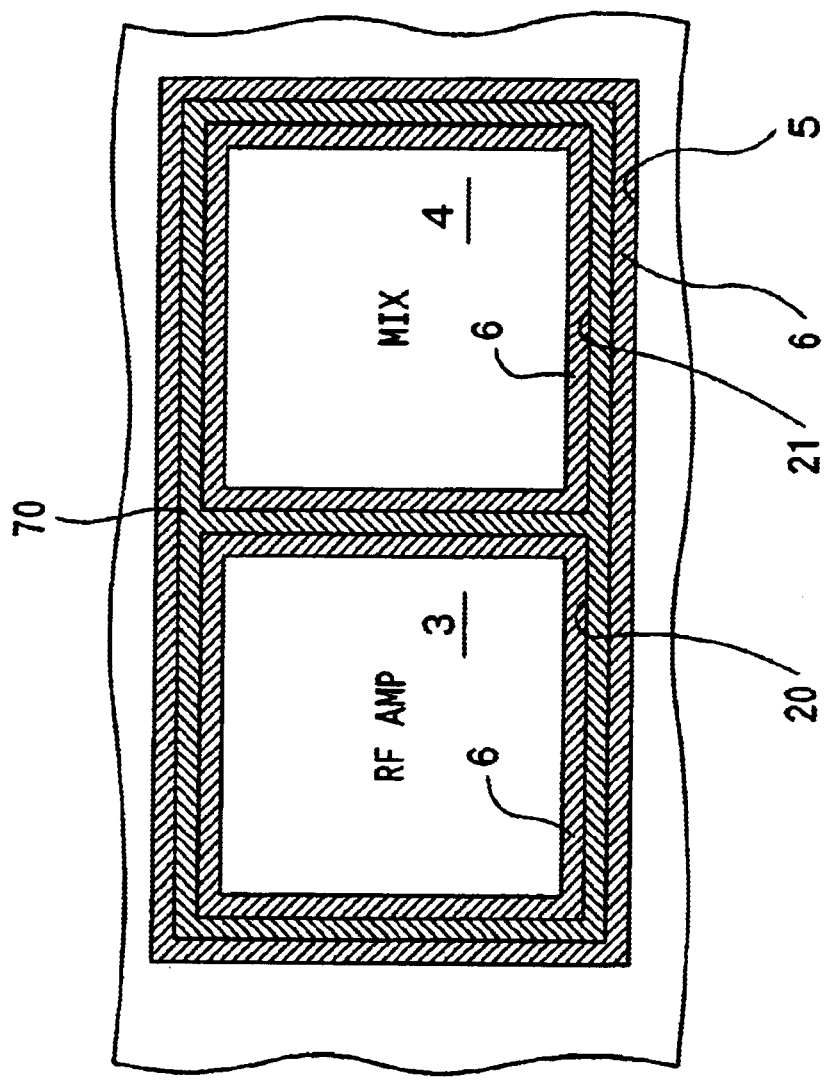
FIG. 13 is a horizontal sectional view showing a part around a major surface of a semiconductor substrate in a manufacturing process of the Embodiment 5.

FIGS. 12 and 13 show (Embodiment 5) of the present invention.

As shown in FIG. 12, in a high frequency integrated device according to (Embodiment 5) of the present invention, ion implantation is performed on a major surface 1A of a semiconductor substrate 1, which is made of Si, so as to form a first circuit region 2A and a second circuit region 2B.

To be specific, the high-frequency integrated device is constituted by a high frequency amplifier 3, which amplifies a high frequency signal exceeding gigahertz[GHz], and a mixer circuit 4, which converts an output signal of the high-frequency amplifier 3 to a first intermediate frequency. The first circuit region 2A is used for the high-frequency amplifier 3, and the second circuit region 2B is used for the mixer circuit 4.

A first trench 20 and a second trench 21 are formed between the high-frequency amplifier 3 and the mixer circuit 4 on the semiconductor substrate 1. As shown in FIG. 13, the first and second trenches 20 and 21 are formed so as to surround the high-frequency amplifier 3 and the mixer circuit 4. The inside of the first and second trenches 20 and 21 is filled with an insulator 6.

As shown in FIG. 12, an n-type implantation region 70 formed by implantation is provided between the first trench 20 and the second trench 21.

Furthermore, as shown in FIG. 12, an interlayer insulating film 8a is formed on the upper layers of the first circuit region 2A and the first trench 20 and over the first trench 20 and the n-type implantation region 70. An interlayer insulating film 8b is formed on the upper layers of the second circuit region 2B and the second trench 21 and over the second trench 21 and the n-type implantation region 70.

Further, a ground conductor 9 is formed on the interlayer insulating films 8a and 8b so as to cover the high-frequency amplifier 3 and the mixer circuit 4.

When the ground conductor 9 is formed, a hole 10 reaching the n-type implantation region 70 is formed on a suitable point of a single interlayer insulating film, which is formed as the interlayer insulating films 8a and 8b, and the ground conductor 9 is also formed in the hole 10 so as to be directly contacted to the n-type implantation region 70. Besides, it is desirable that the surface of the n-type implantation region 70 be silicided to reduce contact resistance.

With this configuration, electromagnetic waves leaked from the high-frequency amplifier 3 or the mixer circuit 4 are coupled to the n-type implantation region 70. Further, since the n-type implantation region 70 is connected to the ground conductor 9, coupled electromagnetic waves are propagated to the ground, resulting in no interference with other regions. Moreover, an end 70a of the n-type implantation region 70 is covered with the entire of the region between the trench 20 and the trench 21, thereby completely interrupting leakage of high frequency electromagnetic wave to the outside of the region.

Therefore, even in a high frequency region whose handling frequency exceeds gigahertz[GHz], it is possible to obtain high-frequency isolation of the first circuit region 2A and the second circuit region 2B.

In addition, DC isolation is improved by forming the first trench 20 and the second trench 21 that are filled with the insulator 6.

(Embodiment 6)

FIGS. 14 to 17 show (Embodiment 6) of the present invention.

Figure 14:
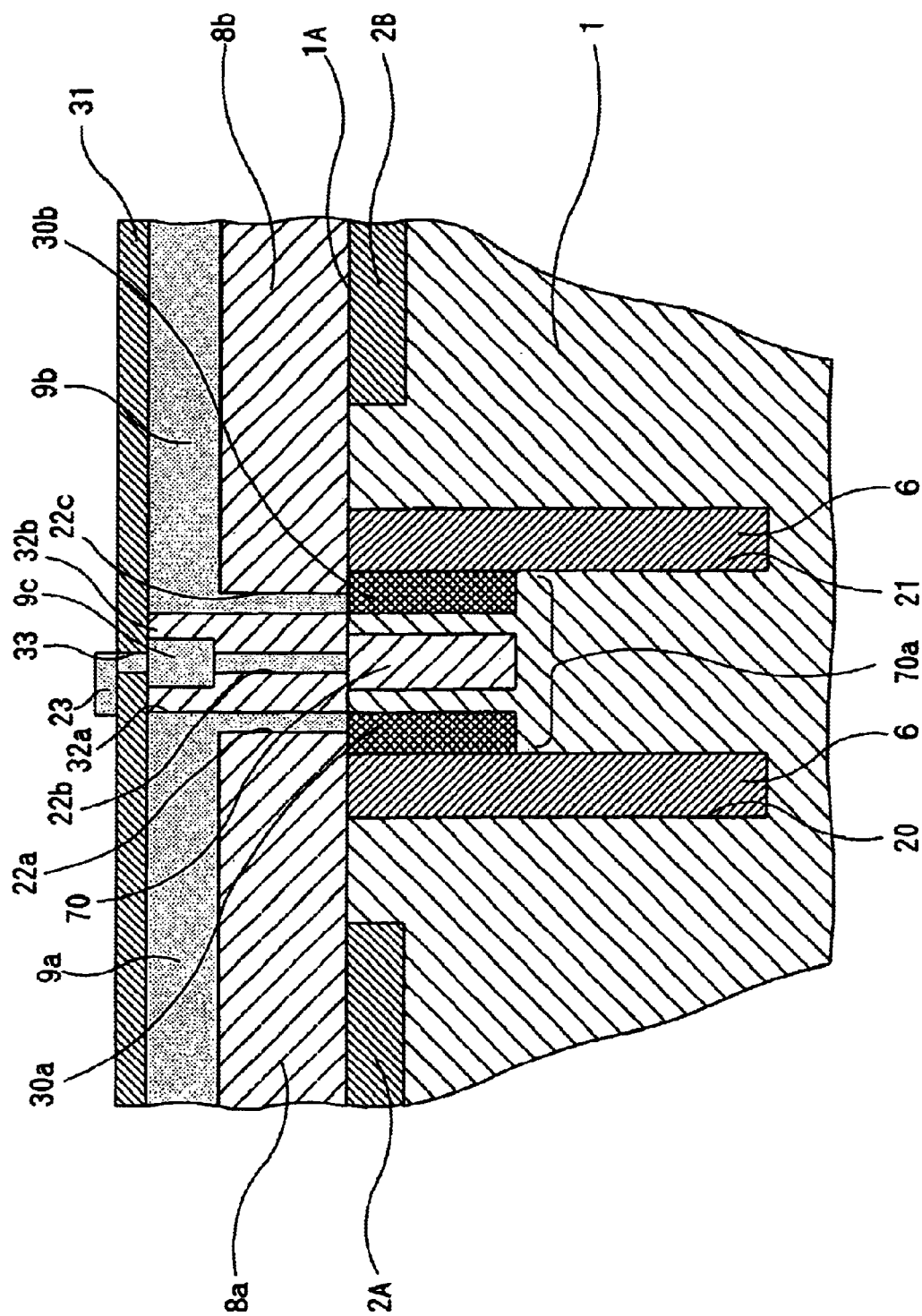
FIG. 14 is an enlarged sectional view showing a high frequency integrated device according to an Embodiment 6 of the present invention.

As shown in FIG. 14, in a high frequency integrated device according to (Embodiment 6) of the present invention, ion implantation is performed on a major surface 1A of a semiconductor substrate 1, which is made of Si, so as to form a first circuit region 2A and a second circuit region 2B.

To be specific, the high frequency integrated device is constituted by a high frequency amplifier 3, which amplifies a high frequency signal exceeding gigahertz[GHz], and a mixer circuit 4, which converts an output signal of the high-frequency amplifier 3 to a first intermediate frequency. The first circuit region 2A is used for the high-frequency amplifier 3, and the second circuit region 2B is used for the mixer circuit 4.

Figure 15:
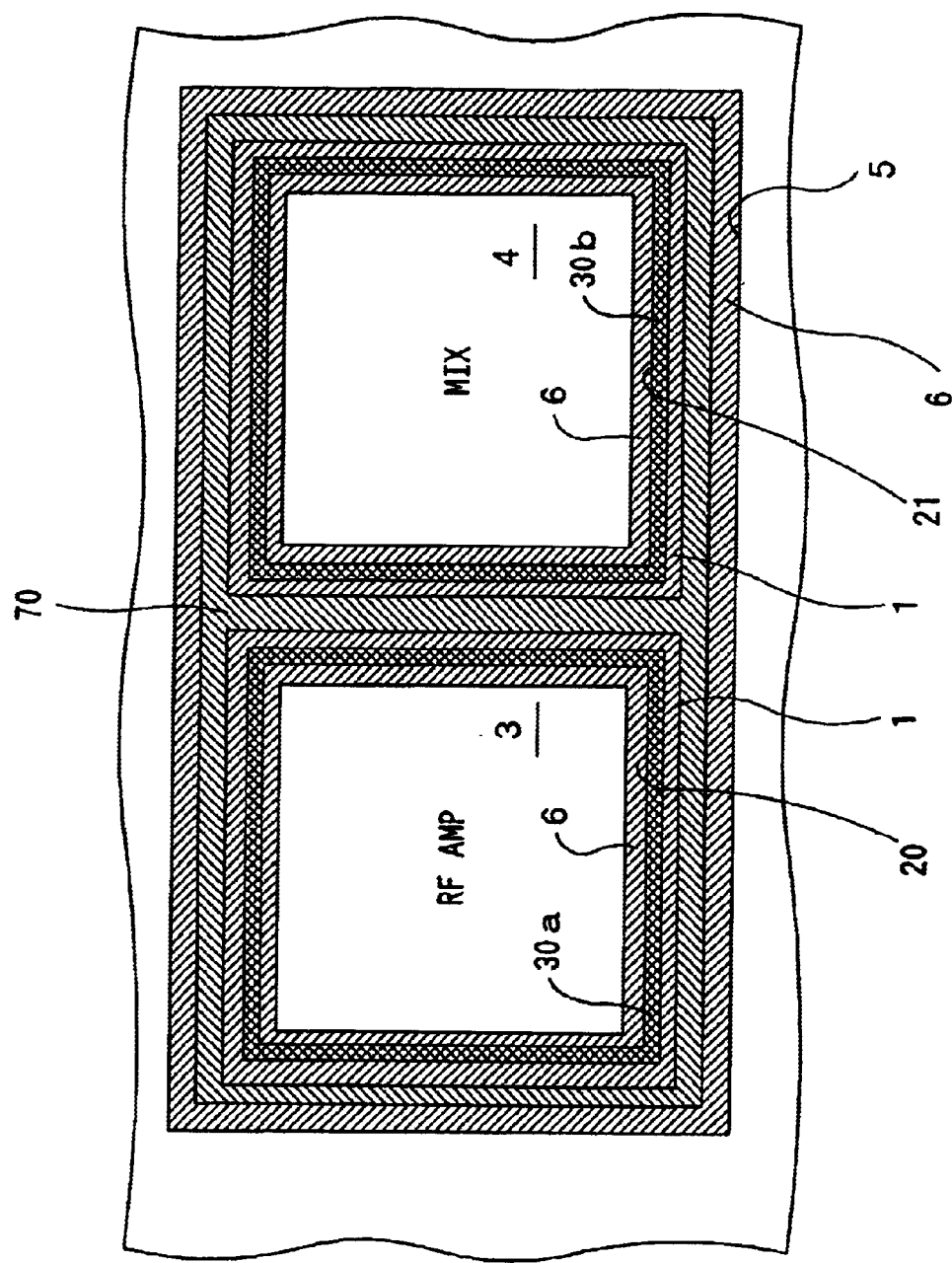
FIG. 15 is a horizontal sectional view showing a part around a major surface of a semiconductor substrate in a manufacturing process according to the Embodiment 6.

On the semiconductor substrate 1, a first trench 20 and a second trench 21 are formed between the high-frequency amplifier 3 and the mixer circuit 4. As shown in FIG. 15, the first and second trenches 20 and 21 are formed so as to surround the high-frequency amplifier 3 and the mixer circuit 4. The inside of the first and second trenches 20 and 21 are filled with an insulator 6.

On the circumference of the first trench 20, a p-type implantation region 30a, which is formed by implanting impurity, is formed so as to surround the first circuit region 2A.

On the circumference of the second trench 21, a p-type implantation region 30b, which is formed by implanting impurity, is formed so as to surround the second circuit region 2B.

An n-type implantation region 70 is formed by implanting impurity between the first trench 20 and the second trench 21 so as to surround the first and second circuit regions 2A and 2B.

Moreover, as shown in FIG. 14, an interlayer insulating film 8a is formed on the upper layers of the first circuit region 2A and the first trench 20 and over the first trench 20 to the n-type implantation region 70. An interlayer insulating film 8b is formed on the upper layers of the second circuit region 2B and the second trench 21 and over the second trench 21 to the p-type implantation region 30.

Further, on the interlayer insulating films 8a and 8b, conductors 9a and 9b are formed so as to cover the high-frequency amplifier 3 and the mixer circuit 4.

Figure 16A:
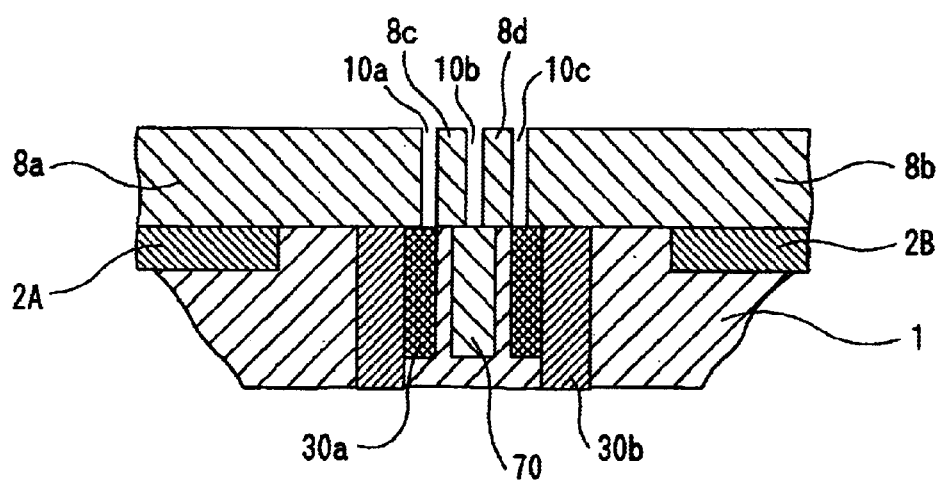
FIG. 16 is a diagram showing the manufacturing process of a major surface of a semiconductor substrate according to the Embodiment 6.
Figure 16B:
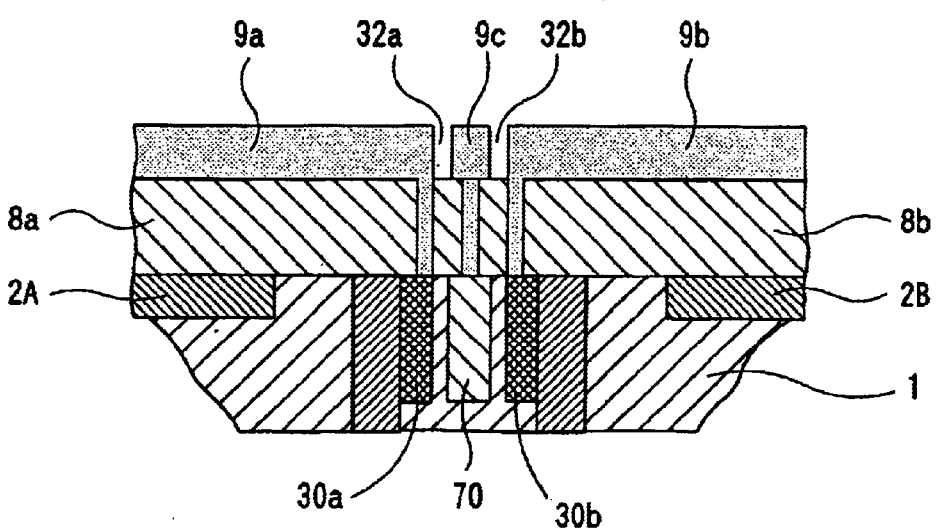
Figure 16C:
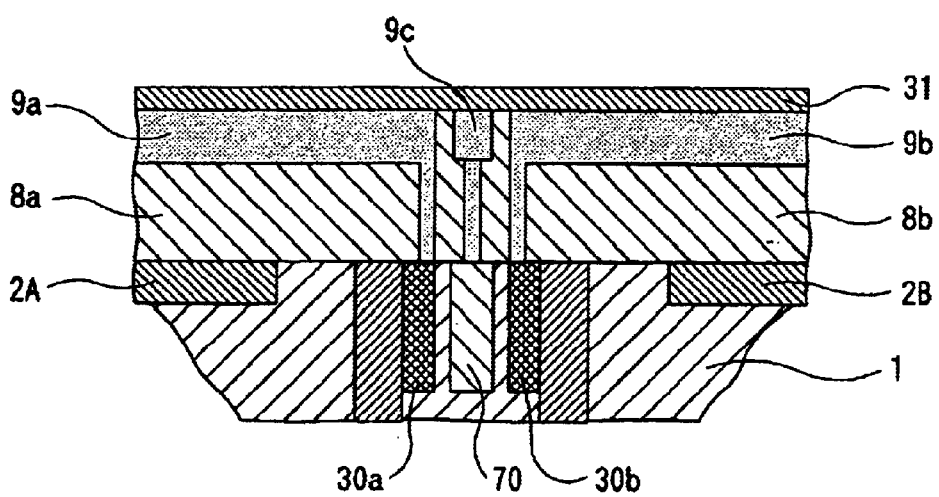
Figure 17:
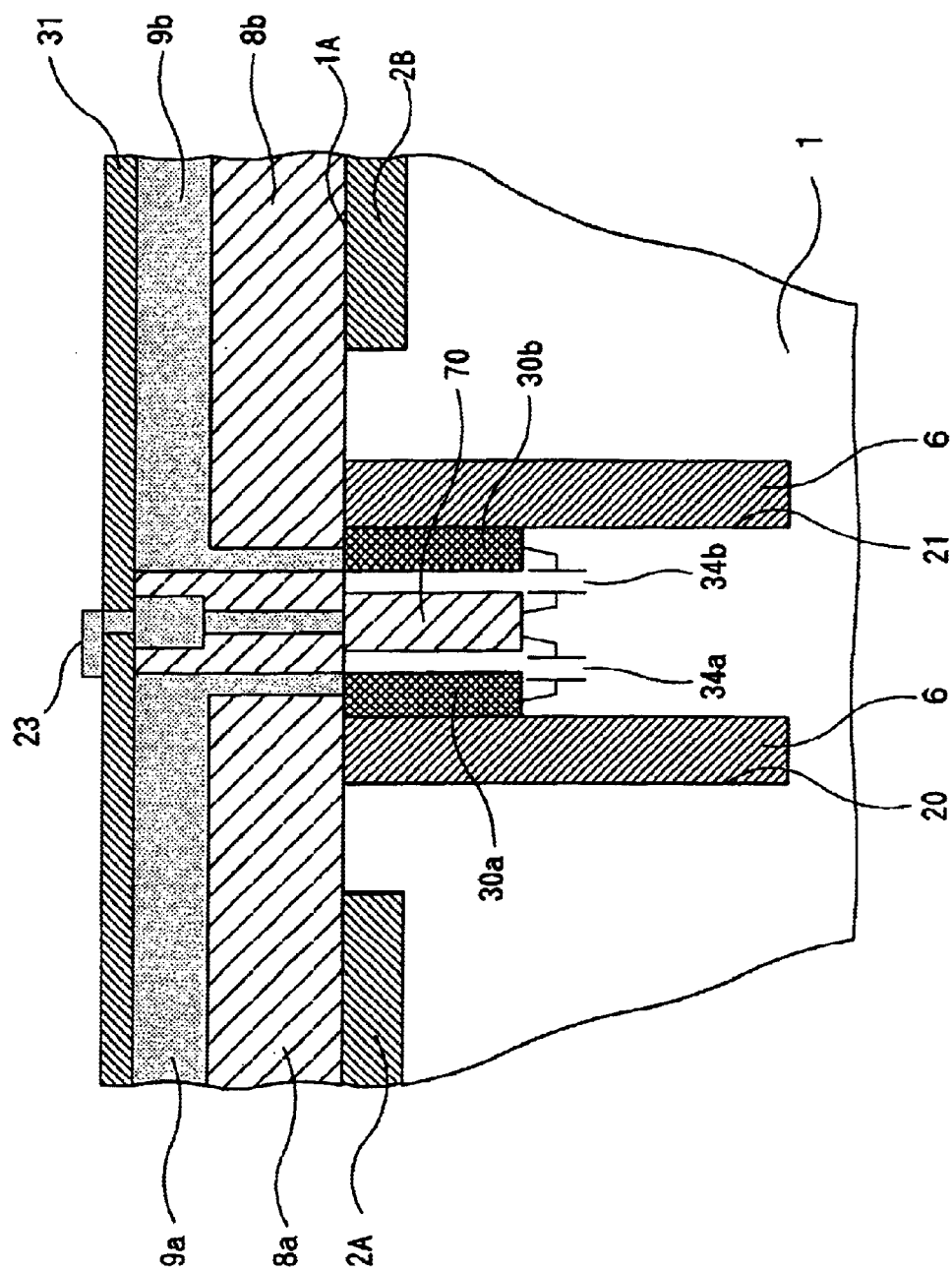
FIG. 17 is an equivalent diagram showing the semiconductor substrate according to the Embodiment 6.
Figure 18:
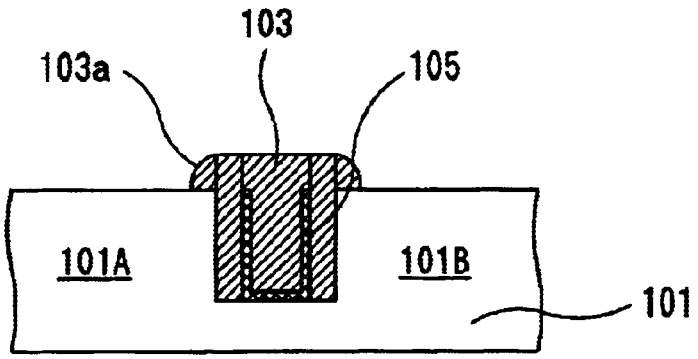
FIG. 18 is an enlarged sectional view showing a high frequency integrated device according to the first conventional art.
Figure 19:
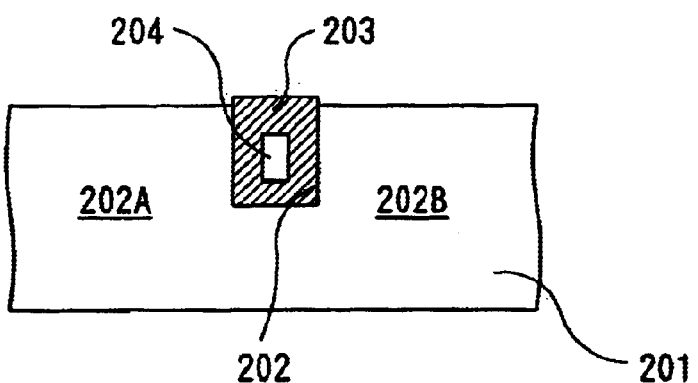
FIG. 19 is an enlarged sectional view showing a high frequency integrated device according to the second conventional art.
Figure 20:
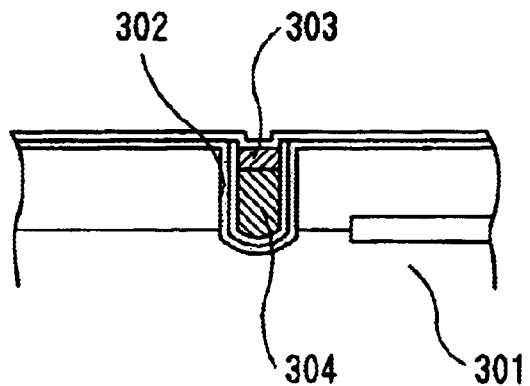
FIG. 20 is an enlarged sectional view showing a high frequency integrated device according to the third conventional art.
Figure 21:
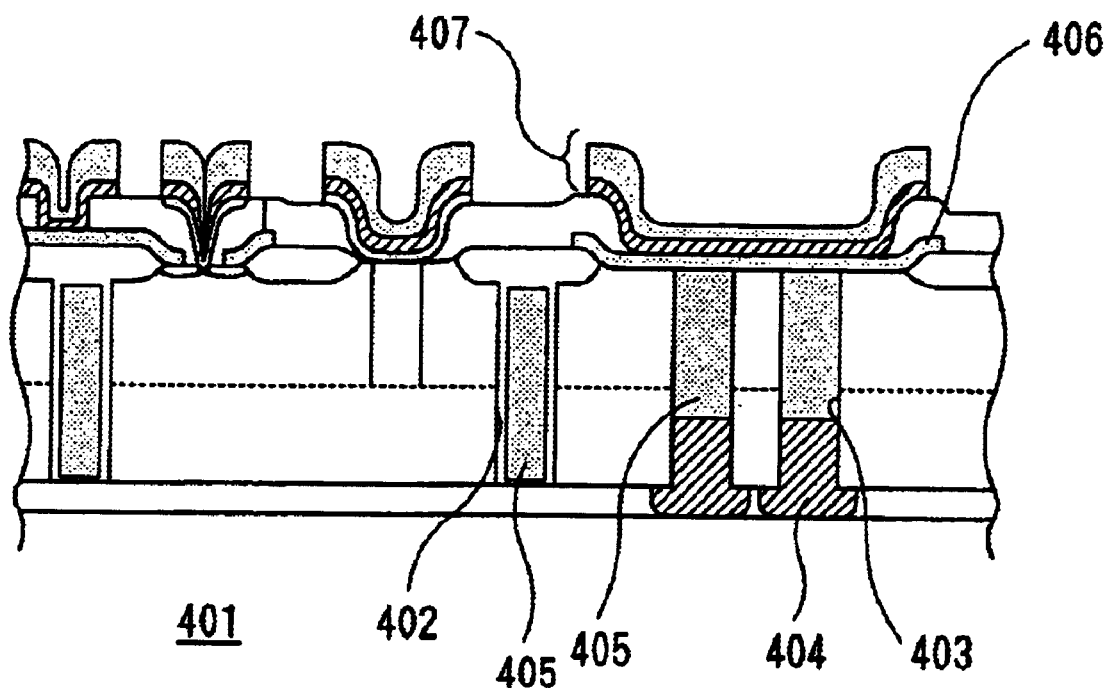
FIG. 21 is an enlarged sectional view showing a high frequency integrated device according to the fourth conventional art.

When the conductors 9a and 9b are formed, after a single interlayer insulating film to be the interlayer insulating films 8a and 8b is formed, the operations of FIGS. 16A to 16C are performed.

First, a single interlayer insulating film to be the interlayer insulating films 8a and 8b is flattened and is selectively etched so as to form the interlayer insulating films 8a and 8b and holes 10a, 10b, and 10c, which respectively reach the p-type implantation region 30a, the n-type implantation region 70, and the p-type implantation region 30b, as shown in FIG. 16A.

Subsequently, as shown in FIG. 16B, conductors 9a, 9b, and 9c are selectively formed in the hole 10a and on the interlayer insulating film 8a, in the hole 10c and on the interlayer insulating film 8c, and in the hole 10b and partially on interlayer insulating films 8c and 8d. Here, a hole 32a where the interlayer insulating film 8d is partially exposed is formed between the conductors 9a and 9c, and a hole 32b where the interlayer insulating film 8c is partially exposed is formed between the conductors 9b and 9c. In this state, the conductor 9a is in contact with the p-type implantation region 30a, and the conductor 9b is in contact with the p-type implantation region 30b.

Next, as shown in FIG. 16C, an insulating film 31 is formed on the conductors 9a, 9b, and 9c. The insulating film 31 is also formed on the holes 32a and 32b.

In order to pull up the conductor 9c onto the insulating film 31, the insulating film 31 is partially etched to form a hole 33 as shown in FIG. 14, and patterning is performed to form the conductor 23 on a suitable point of the insulating film 31, so that the conductor 23 makes contact with the conductor 9c. Bias voltage is applied to the n-type implantation region 70 via the conductor 23.

Besides, it is desirable that the surfaces of the n-type implantation region 70, p-type implantation regions 30a and 30b be silicided to reduce contact resistance.

With this configuration, electromagnetic waves leaked from the high-frequency amplifier 3 are coupled to the p-type implantation region 30a, electromagnetic waves leaked from the mixer circuit 4 are coupled to the p-type implantation region 30b. Here, the n-type implantation region 70 is connected to power supply via the conductor 23, and the p-type implantation regions 30a and 30b are grounded via the conductors 9a and 9b. These conductors have a stabilized potential and work as RF grounds. Thus, electromagnetic waves coupled to the p-type implantation regions 30a and 30b are propagated to ground or a power supply line 23 without causing interference with other regions.

Additionally, when the conductor 23 is coupled to RF ground via a capacitance, it is possible to reduce the diffraction of unnecessary electromagnetic waves to the high-frequency circuit via the conductor 23, thereby achieving better high-frequency grounding.

Further, an end 70a of the n-type implantation region 70 and the p-type implantation region 30 is covered with the entire region between the trench 20 and the trench 21, thereby completely interrupting leakage of high frequency electromagnetic waves to the outside the region.

By applying positive bias to the n-type implantation region 70 via the conductor 23, depletion region is made between the n-type implantation region 70 and the p-type implantation regions 30a and 30b, and coupling capacities 34a and 34b (FIG. 17) are reduced between the n-type implantation region 70 and the p-type implantation regions 30a and 30b. Hence, it is possible to prevent electromagnetic waves, which are coupled to the p-type implantation regions 30a and 30b, from being re-coupled to the p-type implantation regions 30b and 30a, which are adjacent to each other via the n-type implantation region 70, and being propagated to an adjacent circuit region.

Namely, isolation characteristics are further improved by applying positive bias to the n-type implantation region 70. At this moment, since reverse bias of PN junction is applied, excessive power consumption does not occur.

In the present embodiment, as shown in FIG. 14, a spatial distance is provided between the n-type implantation region 70 and the p-type implantation regions 30a and 30b so as to form a PIN diode. Thus, it is possible to reduce coupling capacities 34a and 34b between the n-type implantation region 70 and the p-type implantation regions 30a and 30b.

Therefore, even in a high frequency region whose handling frequency exceeds gigahertz[GHz], it is possible to obtain high-frequency isolation of the first circuit region 2A and the second circuit region 2B. Moreover, DC isolation is improved by forming the first trench 20 and the second trench 21 that are filled with the insulator 6.

In (Embodiment 1) to (Embodiment 4) of the present invention, a step of forming the conductive material 7 on the inner wall of the trench 5 is necessary in addition to the forming process of a transistor (not shown) included in the high-frequency amplifier 3 or the mixer circuit 4. In contrast, in (Embodiment 5) and (Embodiment 6) of the present invention, as a step of isolating transistors, at the same time as an ordinary trench forming step, the trenches 20 and 21 are formed for DC isolation between the high-frequency amplifier 3 and the mixer circuit 4. Furthermore, the n-type implantation region 70 can be simultaneously formed by ion implantation, which is performed in the formation of an active region (not shown) of the transistor included in the high-frequency amplifier 3 or the mixer circuit 4. Hence, it is possible to obtain good matching with the process of forming a typical transistor such as MOS, Bipolar, and BiCMOS.

The above-mentioned embodiments described as an example the case where high-frequency isolation is obtained on the high-frequency amplifier (LNA) 3 constructed on the first circuit region 2A and the mixer circuit 4 constructed on the second circuit region 2B. It is fundamentally important to prevent high-frequency power from being leaked from a single high-frequency circuit block. The present invention can be used for suppressing radiation of electromagnetic waves from a single high-frequency circuit block such as an LNA, a mixer, a power supply amplifier block (PA), and a voltage control oscillator (VCO). The configuration of FIG. 14 including the first and second trenches 20 and 21, the p-type implantation regions 30b and 30a, and the n-type implantation region 70 is not limited to the formation between adjacent high-frequency circuit blocks.

In the above-mentioned embodiments, it is assumed that the semiconductor substrate 1 is made of Si. However, when GaAs and InP, which are superior to Si in DC insulation, are used for the semiconductor substrate 1, the first and second trenches 20 and 21 for DC isolation are not always necessary.

As shown in FIG. 14, (Embodiment 5) and (Embodiment 6) of the present invention described as an example the case where a spatial distance is provided between the n-type implantation region 70 and the p-type implantation regions 30a and 30b to form a PIN diode. PN junction is also applicable where the n-type implantation region 70 and p-type implantation regions 30a and 30b are in contact with each other.

As described above, according to the high frequency integrated device of the present invention, a trench formed on a semiconductor substrate is filled with a conductive material, which has lower resistance than the insulating film, via an insulating film, and the conductive material is grounded through coupling at high frequency. Thus, sufficient isolation can be obtained even in a high frequency region whose handling frequency exceeds gigaheartz [GHz].

Moreover, when the conductive material is connected to a ground conductor formed of a conductive substance via a capacitance that is sufficient to make a short circuit at a handling frequency, it is possible to prevent noise components on the ground conductor from interfering with other parts from the conductive material.

Also, when an insulating film comprising one or more layers is formed on the side wall and the bottom of the trench, DC isolation is improved.

Besides, when an impurity region is formed on the side wall and the periphery of the bottom of the trench, DC isolation characteristics are improved.

What is claimed is:

1. A high frequency integrated circuit device, comprising:
    a semiconductor substrate having a plurality of circuits and a ground conductor mounted thereon, and
    a trench surrounding each of said circuits, the trench surrounded by an insulating film and filled with a conductive material having lower resistance than a resistance of said insulating film, wherein the conductive material and the ground conductor are located so that the conductive material can be grounded to the ground conductor either directly or through coupling at high frequency,
    a circuit connected in series with said conductive material and said ground conductor, said circuit having a capacitance value that is sufficient to cause a short circuit, at least at a specified frequency, between the conductive region and the ground conductor.

2. The high frequency integrated circuit device according to claim 1, further comprising an insulating film having located therein a hole filled with a ground conductor, wherein the conductive material filling the trench is directly connected to the ground conductor.

3. The high frequency integrated circuit device according to claim 1, wherein an insulating film comprising one or more layers is formed on a side wall and a bottom of the trench.

4. The high frequency integrated circuit device according to claim 1, wherein an impurity region is located on the side wall and a periphery of the bottom of the trench.

5. The high frequency integrated circuit device according to claim 1, wherein the trench is located in a major surface of the semiconductor substrate, and the conductive material is grounded to a ground conductor through coupling at high frequency, said ground conductor being located on said major surface of said semiconductor substrate with an interlayer insulating film located between said ground conductor and said semiconductor substrate.

6. The high frequency integrated circuit device according to claim 1, wherein the semiconductor substrate comprises Si.

7. The high frequency integrated circuit device according to claim 1, wherein the semiconductor substrate has circuit regions thereon, each of said circuit regions having one or more semiconductor elements selected from a group consisting of an N-type channel MOSFET, a P-type channel MOSFET and a bipolar transistor, and the trench divides said circuit region.

8. The high frequency integrated circuit device according to claim 1, wherein the semiconductor substrate comprises $Si_{(1-x)}Ge_x$ ($0 < x \leq 1$).

9. A high frequency integrated circuit device, comprising a semiconductor substrate having a plurality of circuits mounted thereon:
    a ground conductor,
    first and second trenches surrounding each of said circuits located in the semiconductor substrate, each of said trenches being filled with an insulator, and
    a conductive region located at a position between said first and second trenches,
    a circuit connected in series with said conductive region and said ground conductor, said circuit having a capacitance value that is sufficient to cause a short circuit, at least at a specified frequency, between the conductive region and the ground conductor.

10. The high frequency integrated circuit device according to claim 9, wherein the semiconductor substrate comprises a material whose insulating capability under direct current exceeds that of silicon.

11. A high frequency integrated circuit device comprising a semiconductor substrate having a plurality of circuits and a ground conductor thereon:
- a trench surrounding each of said circuits and filled with an insulator,
- a first conductive region located at a position outside said trench, and
- a second conductive region located outside said first conductive region and separate from said first conductive region,
- a circuit connected in series with said first conductive region and said ground conductor, said circuit having a capacitance value that is sufficient to cause a short circuit, at least at a specified frequency, between the first conductive region and the ground conductor,
- wherein said second conductive region is depletable by a bias voltage applied thereto, to reduce a coupling capacitance of said first conductive region and said second conductive region.

12. The high frequency integrated circuit device according to claim 11, wherein the first conductive region is for being grounded at DC and comprises a P-type doped region, and the second conductive region is for being connected to a positive bias and comprises an N-type doped region.

13. The high frequency integrated circuit device according to claim 12, wherein each conductive region contains an impurity.

* * * * *